(12) United States Patent
Bai et al.

(10) Patent No.: US 10,132,851 B2
(45) Date of Patent: Nov. 20, 2018

(54) PATCH CORD AND MANAGEMENT SYSTEM AND MANAGEMENT METHOD THEREOF

(71) Applicant: Corning Research & Development Corporation, Corning, NY (US)

(72) Inventors: Xiaoyang Bai, Shanghai (CN); Zhijun Yang, Shanghai (CN); Min Ding, Shanghai (CN)

(73) Assignee: Corning Research & Development Corporation, Corning, NY (US)

( * ) Notice: Subject to any disclaimer, the term of this patent is extended or adjusted under 35 U.S.C. 154(b) by 0 days.

(21) Appl. No.: 15/520,657

(22) PCT Filed: Nov. 26, 2015

(86) PCT No.: PCT/CN2015/095651
§ 371 (c)(1),
(2) Date: Apr. 20, 2017

(87) PCT Pub. No.: WO2016/086793
PCT Pub. Date: Jun. 9, 2016

(65) Prior Publication Data
US 2017/0315167 A1    Nov. 2, 2017

(30) Foreign Application Priority Data
Dec. 1, 2014    (CN) .......................... 2014 1 0718697

(51) Int. Cl.
*H01R 3/00* (2006.01)
*G01R 31/04* (2006.01)
(Continued)

(52) U.S. Cl.
CPC ............. *G01R 31/04* (2013.01); *H04Q 1/136* (2013.01); *H04Q 1/14* (2013.01)

(58) Field of Classification Search
CPC ....................................................... G01R 31/04
(Continued)

(56) References Cited

U.S. PATENT DOCUMENTS 6,222,908 B1    4/2001    Bartolutti et al.
6,424,710 B1    7/2002    Bartolutti et al.
(Continued)

FOREIGN PATENT DOCUMENTS

CN    2764006 U    3/2006
CN    102027754    4/2011
(Continued)

OTHER PUBLICATIONS

Search Report for CN Application No. 2014107186976, dated Aug. 3, 2017, 1 page.
(Continued)

*Primary Examiner* — Tulsidas C Patel
*Assistant Examiner* — Peter G Leigh
(74) *Attorney, Agent, or Firm* — Brad C. Rametta

(57) ABSTRACT

A patch cord, a management system and a management method thereof are provided. The patch cord (10) comprises a connection line portion (11), a first connector (21) arranged at a first end of the connection line portion (11), a second connector (22) arranged at a second end of the connection line portion (11), a first communication unit (31) arranged at near the first connector (21) including a first identifier and a second communication unit (32) arranged near the second connector (22) including a second identifier, wherein the first and second identifiers contain unique identify information for identifying the first connector and the second connector, respectively, and wherein the first identifier is different from the second identifier. The management system and the management method can differentiate connectors at the both ends of the patch cord by self-identification.

15 Claims, 7 Drawing Sheets

(51) Int. Cl.
*H04Q 1/14* (2006.01)
*H04Q 1/02* (2006.01)

(58) Field of Classification Search
USPC .................. 439/488, 489, 49; 385/147, 135
See application file for complete search history.

(56) References Cited

U.S. PATENT DOCUMENTS

| | | | |
|---|---|---|---|
| 6,968,994 B1 | 11/2005 | Ashwood | |
| 7,352,285 B2 * | 4/2008 | Sakama | G06K 7/10178 340/539.1 |
| 7,605,707 B2 * | 10/2009 | German | H01R 13/465 340/572.7 |
| 7,921,235 B2 * | 4/2011 | Best | H01R 9/2475 439/488 |
| 8,026,813 B2 | 9/2011 | Saito et al. | |
| 8,092,249 B2 * | 1/2012 | German | H04Q 1/138 439/489 |
| 8,181,229 B2 * | 5/2012 | Macauley | H04Q 1/138 340/572.7 |
| 8,333,518 B2 * | 12/2012 | Jones | G02B 6/3879 340/10.1 |
| 8,427,335 B2 * | 4/2013 | Caveney | H04Q 1/138 340/687 |
| 8,665,107 B2 * | 3/2014 | Caveney | H04Q 1/138 340/687 |
| 2003/0021580 A1 * | 1/2003 | Matthews | H04B 10/00 385/147 |
| 2005/0215119 A1 * | 9/2005 | Kaneko | G06K 7/10178 439/607.01 |
| 2005/0224585 A1 * | 10/2005 | Durrant | G02B 6/3807 235/492 |
| 2006/0049942 A1 * | 3/2006 | Sakama | G06K 7/10178 340/572.1 |
| 2007/0013487 A1 * | 1/2007 | Scholtz | G02B 6/3895 340/10.41 |
| 2010/0085156 A1 * | 4/2010 | Tucker | G06K 19/0717 340/10.1 |
| 2010/0210135 A1 * | 8/2010 | German | H04Q 1/138 439/491 |
| 2011/0097925 A1 | 4/2011 | Caveney et al. | |
| 2012/0281509 A1 * | 11/2012 | Liang | H04Q 1/136 367/197 |
| 2013/0076589 A1 | 3/2013 | Caveney | |
| 2013/0078848 A1 * | 3/2013 | Kummetz | H04Q 1/138 439/488 |
| 2014/0141649 A1 * | 5/2014 | Standish | G06K 7/10415 439/620.01 |
| 2016/0097801 A1 * | 4/2016 | Polland | G01R 31/04 324/538 |

FOREIGN PATENT DOCUMENTS

| | | |
|---|---|---|
| CN | 103561358 | 2/2014 |
| EP | 2 474 936 A1 | 7/2012 |
| WO | WO 2014-099654 | 6/2014 |
| WO | WO 2016-089611 | 6/2016 |

OTHER PUBLICATIONS

International Search Report for PCT International Application No. PCT/CN2015/095651, dated Feb. 18, 2016, 5 pages.

European Office Action for EP15864544; dated Jun. 26, 2018; 7 pages; European Patent Office.

* cited by examiner

PATCH CORD AND MANAGEMENT SYSTEM AND MANAGEMENT METHOD THEREOF

TECHNICAL FIELD

The present invention relates to the field of network cabling management, in particular to patch cord used in smart wiring devices and management system and management method thereof.

BACKGROUND ART

With the development and popularization of broadband network, network administrators are required to manage a wide, or super wide range of network cabling.

In traditional cabling management system, port information needs to be written on paper documents and then be manually entered into back-office management computer. This process often leads to inconsistency between actual connection information and the information in back-office management computer due to human error. In addition, cabling in computer rooms, data centers, or other application sites can be very messy, and it is hard to know the exact port usage rate, for example, which ports are used and which ports are unused. In particular, it is easy to make mistakes when the network connection between the switch and the distribution frame needs to be changed when integrated wiring changes.

More recently, a metal appendage or tag has been added on the joint of each patch cord to detect the presence of patch cord by infrared, magnetism, conductive contact, etc. Meanwhile, non-contacting RFID technology solution have been proposed. For example, a communication connection system was proposed, in which RFID tags are provided on the connector at both ends of the patch cord where both RFID tags include the same identifier. Then when the connector of patch cord is inserted into the port on the wiring panel, corresponding RFID antenna can detect the identifier of RFID tags, thus identifying the presence of patch cord. However, the shortcoming for applying RFID technical solution is that it cannot differentiate the two ends of the patch cord and cannot effectively distinguish which port a specific end of the two ends of the patch cord is inserted into.

Therefore, an improved patch cord and its identification method and/or patch cord identification system has become a hot topic in the field.

SUMMARY OF INVENTION

The present invention aims at overcoming or alleviating at least one or more technical problems in the prior art.

One purpose of the present invention is to provide a patch cord, by which differentiation of connectors at two ends can be realized by self-identification.

Another purpose of the present invention is to provide a patch cord management method, by which differentiation of connectors at two ends can be realized by self-identification.

Another purpose of the present invention is to provide a patch cord management system, by which differentiation of connectors at both ends can be realized by self-identification.

A patch cord is provided according to the first aspect of the present invention, which comprises:

a connection line portion;

a first connector arranged at the first end of the connection line portion;

a second connector arranged at the second end opposite to the first end of the connection line portion;

a first communication unit being set to the first connector and including a first identifier; and a second communication unit being set to the second connector and including a second identifier;

wherein the first and second identifiers contain unique identity information for identifying the first connector and the second connector respectively, and the first identifier is different from the second identifier.

According to the embodiments of the present invention, the first communication unit in the patch cord is provided with a first read-only area and a first readable/writable area, and the first identifier is stored in the first read-only area; and the second communication unit is provided with a second read-only area and a second readable/writable area, and the second identifier is stored in the second read-only area. Optionally, the first read-only area and the first readable/writable area is continuous and orderly and the first read-only area is located before the first readable/writable area; and the second read-only area and the second readable/writable area is continuous and orderly, and the second read-only area is located before the second readable/writable area. The first readable/writable area of the first communication unit at least stores the second identifier of the second communication unit; and the second readable/writable area of the second communication unit at least stores the first identifier of the first communication unit. Preferably, the first identifier and the second identifier form the first composite identifier in sequence in the first communication unit according to certain rules; and correspondingly, the second identifier and the first identifier form the second composite identifier in sequence in the second communication unit according to certain rules.

According to some embodiments of the present invention, the first communication unit in the patch cord is coupled to the first connector by injection molding or adhesive, and the second communication unit is coupled to the second connector by injection molding or adhesive. While according to the other embodiments of the present invention, the first communication unit may be detachably connected to the first connector through the first carrier, and the second communication unit may be detachably connected to the second connector through the second carrier.

Preferably, the patch cord is metal cable or fiber optic cable and the first and second communication units are RFID tags.

A patch cord management system is provided according to the second aspect of the present invention, which comprises multiple patch cords as mentioned above; a wiring panel with multiple ports of the first connector or the second connector suitable for plugging the patch cord; multiple communication matching units respectively arranged near the multiple ports to wirelessly communicate with the first communication unit and/or the second communication unit; and a communication terminal connected to multiple communication matching units.

Preferably, the first and second communication units are RFID tags; the communication matching unit is RFID antenna; the communication terminal includes RFID reader; and the first and second communication units communicate with the communication matching unit by non-contact radio frequency identification technology.

A patch cord management method is provided according to the third aspect of the present invention, wherein the patch cord comprises a connection line portion, a first connector, a second connector, a communication unit and a second communication unit. The first connector and the second connector are respectively arranged at the first end and the second end opposite to the first end of the connection line portion. The first communication unit is set to the first connector and the second communication unit is set to the second connector. The management method includes the following steps: writing the first identifier including unique identity information for identifying the corresponding first connector in the first communication unit of the patch cord, and writing the second identifier including unique identity information for identifying the corresponding second connector in the second communication unit of the patch cord, wherein the first identifier is different from the second identifier. With this method, using different first and second identifiers to respectively label the first connector and the second connector at two ends of a patch cord is realized.

To be specific, the above management method further comprises reading the first identifier in the first communication unit, reading the second identifier in the second communication unit, writing the read first identifier in the second communication unit; and writing the read second identifier in the first communication unit. Furthermore, the first identifier and the second identifier form the first composite identifier in the first communication unit according to certain rules, while the second identifier and the first identifier form the second composite identifier in the second communication unit according to certain rules, wherein the first composite identifier is different from the second composite identifier.

According to some embodiments of the present invention, the first connector of the patch cord is inserted into one port of the wiring panel, and the information of the first identifier of the first communication unit corresponding to the first connector and the information of the port are written into a database. At this moment, the first identifier is used to look for the information of corresponding port in the database or the information of the port is used to look for corresponding first identifier; while the identified information of the port is used to look for and locate the first connector, or the identified first identifier is used to look for and locate the position of the port.

According to other embodiments of the present invention, the first connector of the patch cord is inserted into one port of wiring panel, and the information of the first composite identifier of the first communication unit and the information of the port are written into a database. At this moment, the first composite identifier is used to look for the information of corresponding port in the database or the information of the port is used to look for corresponding first composite identifier; while the identified information of the port is used to look for and locate the first connector, or the first composite identifier is used to look for and locate the position of the port.

According to yet some other embodiments of the present invention, the first connector and second connector of the patch cord are inserted into the ports of wiring panel respectively; the information of the first identifier and the first composite identifier of the first communication unit and the information of corresponding port are written into a database; and the information of the second identifier and the second composite identifier of the second communication unit and the information of corresponding port are written into the database. At this moment, the first identifier and/or the first composite identifier is used to look for the second identifier of the second connector in the database, and the identified second identifier is used to look for the second connector.

At least some embodiments of the present invention achieve the following technical effects: the patch cord, the management method and management system thereof provided by the embodiment of the present invention maintains a unique identifier of connectors at each end with radio frequency technology by respectively arranging unique identifier on the connectors at both ends, so as to differentiate the connectors at both ends of the patch cord by self-identification, and to match, look for and locate the two ends while maintaining the unique self-identification of each end of patch cord by ensuring both ends of the same patch cord respectively contain the information of the opposite end.

Other achievable purposes and technical effects of the present invention will be illustrated in the following specific embodiments in combination with the description and schematic diagrams of specific embodiments.

BRIEF DESCRIPTION OF FIGURES

To make the aforementioned and other purposes, features and advantages of the present invention more obvious and easier to understand, the following paragraphs will illustrate the present invention with the appended figures and specific embodiments.

DESCRIPTION OF EMBODIMENTS

Specific embodiments of the present invention are described below and examples of the specific embodiments are shown in the figures, in which the same reference symbols always indicate the same or similar items. The specific embodiments described by the following figures are to explain the present invention, and are not intended to limit the present invention.

Figure 1:
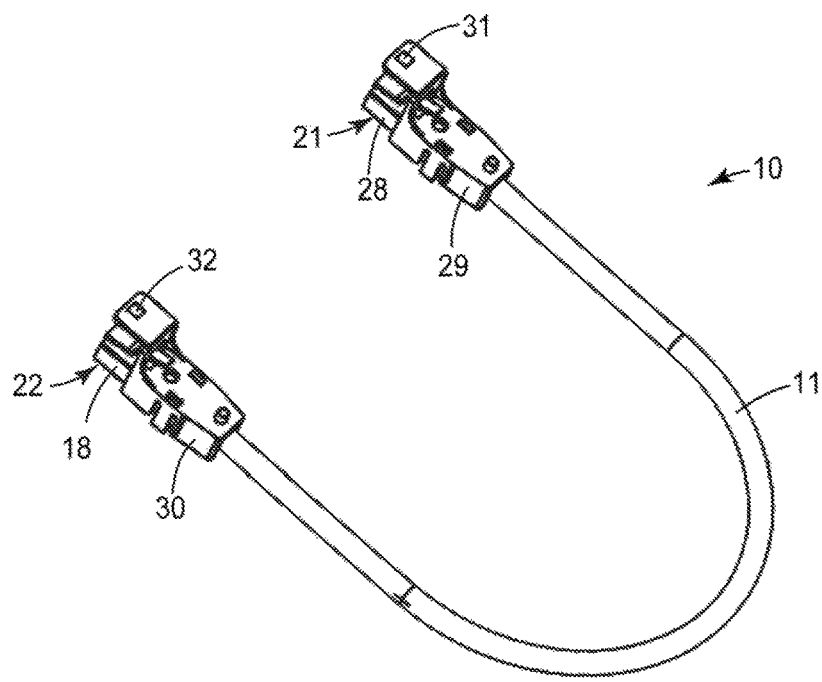
FIG. 1 shows a structural schematic diagram of a patch cord based on one specific embodiment of the present invention.

An embodiment of the present invention provides a patch cord (10) applicable to network cabling system as shown in FIG. 1.The patch cord comprises a connection line portion (11), a first connector (21) arranged at the first end of the connection line portion (11) and a second connector (22) arranged at the second end opposite to the first end of the connection line portion (11). According to the embodiment of the present invention, a first communication unit (31) including a first identifier,is arranged near the first connector (21) and a second communication unit (32) including a second identifier,is arranged near the second connector (22), wherein the first and second identifiers contain unique identity information for identifying corresponding first connector (21) and second connector (22) respectively, and the first identifier is different from the second identifier. As the first communication unit (31) including the first identifier and the second communication unit (32) including the second identifier are respectively arranged at two ends of the patch cord, and the first identifier is different from the second identifier, two ends of the patch cord may be effectively differentiated, thus realizing self-identification of two ends of the patch cord.

According to the embodiment of the present invention, the patch cord (10) can be metal/electrically conductive-patch cord or fiber optic patch cord. Specifically, the line connectionline portion (11) can be metal-core cable, glass fiber optical cable and other single-core or multi-core cable harness for energy or photoelectric signal transmission, such as multi-core twisted-pair wire cable harness for electrical signal communication or single/multi-core optical fiber. The first connector (21) and the second connector (22) at two ends of the patch cord are used to connect and lock the patch cord in portson a distribution frame, in order to realize energy or signal communication between said ports. For example, the first connector (21) and the second connector (22) may apply an RJ45connector, an FC, SC or LC optical fiber connector, etc. In the embodiment as illustrated in FIG. 1, the patch cord (10) is multi-core twisted-pair wire cable harness, wherein the first connector (21) and the second connector (22) are RJ45 connectors.

Figure 2:
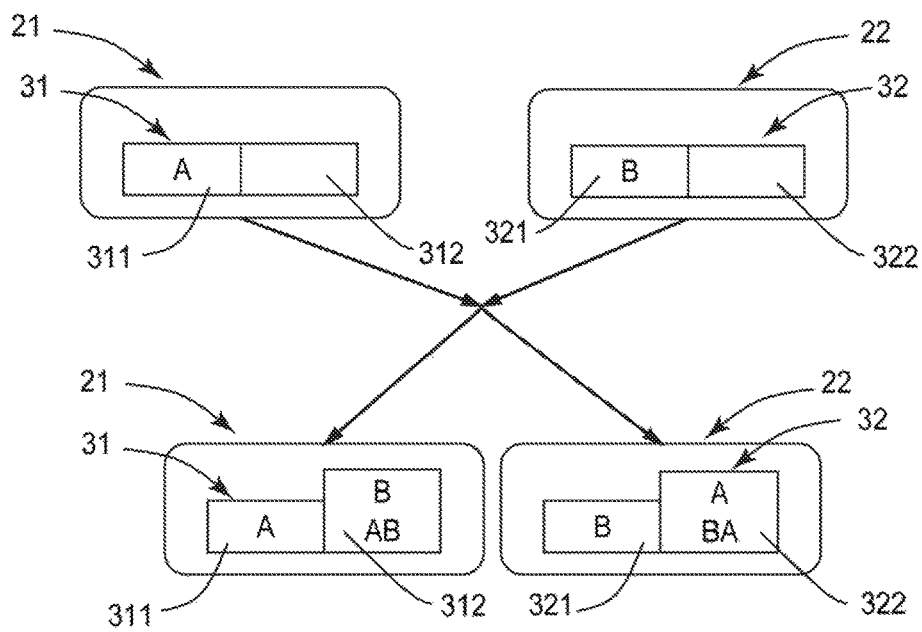
FIG. 2 shows a schematic diagram of the first and second communication units in an embodiment of a patch cord of the present invention.

For example, FIG. 2 shows a schematic diagram of the first and second communication units in an embodiment of a patch cord. As shown, the first communication unit (31) is provided with a first read-only area (311) and a first readable/writable area (312). The first identifier, designated "A" herein,of the first communication unit is stored in the first read-only area (311). Similarly, the second communication unit (32) is provided with a second read-only area (321) and a second readable/writable area (322), and the second identifier, designated "B" herein, of the second communication unit is stored in the second read-only area (322). Once written, the first and second identifiers are permanent or are read-only information that cannot be rewritten. In one aspect, the first readable/writable area (312) of the first communication unit (31) stores at least the second identifier (B) of the second communication unit (32), and the second readable/writable area (322) of the second communication unit (32) stores at least the first identifier (A) of the first communication unit (31). In this way, communication units at the two ends of the same patch cord contain the information of the communication unit located at the opposite end. Thus, matching of the two ends may be realized, while maintaining the unique self-identification of each end of the patch cord.

Alternatively, other information, in addition to the identifier information for the self-identification of the patch cord, may be written in the first and second readable/writable areas of the patch cord, such as the type and usage status of the patch cord, respectively as well as the first and second readable/writable identifiers.

Furthermore, in other embodiments, the first identifier (A) and the second identifier (B) can be used to form a first composite identifier, herein designated "AB", in the first communication unit (31) according to certain rules, such as in sequence by concatenating the first identifier (A) with the second identifier (B) or employing certain algorithm (e.g. adding A+B, multiplying A×B, etc). Correspondingly, the second identifier (B) and the first identifier (A) can form a second composite identifier, herein designate "BA", in the second communication unit (32) according to certain rules, such as in sequence by concatenating the second identifier (B) with the first identifier (A) or by employing certain algorithm (e.g. adding B+A, multiplying B×A, etc). The first composite identifier (AB) and the second composite identifier (BA) can be stored in the first and second readable/writable areas (312, 322), respectively. For example, when the first identifier (A) in the first read-only area (311) of the first communication unit (31) is bound to the second identifier (B) in the second read-only area (321) of the second communication unit (32), the first composite identifier (AB) can be stored in the first readable/writable area (312) of the first communication unit (31).

Alternatively, when the first identifier (A) stored in the second readable/writable area (322), the second composite identifier (BA) can be stored in the second readable/writable area (322) of the second communication unit (32).

In these ways, the first communication unit (31) and the second communication unit (32) maintain the uniqueness of identifiers stored therein. The benefit is that for the connection lines inserted into the ports of distribution frame, it is still possible to independently look for the port position associated with either end of the patch cord on the distribution frame independently through the recording of the unique identifiers and/or the composite identifiers stored in each communication unit. Thus, unique identifiers and/or the composite identifiers may be used to look for the other end of the patch cord. Therefore, a two-end matching method can be used to identify a patch cord without losing the uniqueness of both of its ends.

According to the embodiment of the present invention, the first communication unit (31) and the second communication unit (32) can beradio frequency identification (RFID) tags, which include a non-contact wireless chip that can transmit information via radio frequency signals. Specific forms of RFID tags include near-field communication (NFC) chips (ISO15693) in a plastic package, etc. The communication distance of an RFID tag using non-contact communication can be from less than one millimeter to several centimeters, e.g., around 3 mm. The RFID tag of the present inventioncan bean active or passive tag, with an operating frequency in the high frequency (HF), the ultra-high frequency (UHF), or other frequency ranges.

Referring to FIG. 2, both the first communication unit (31) and the second communication unit (32) in the patch cord of the present invention include a read-only area and a readable/writable area, thus, the memory circuit of the RFID tag is arranged to contain the read-only area stored with unique identifier and readable/writable area which is free to write and then read additional information. For example, the memory circuit includes electrically erasable programmable read-only memory (EEPROM), FLASH memory, etc. In the embodiments as illustrated in FIG. 1 and FIG. 2, the memory circuit in the RFID tag is EEPROM. The readable/writable area of RFID tag associatedfirst connector (21) (i.e. the first communication unit (31)) stores at least the second identifier "B" from the RFID tag (i.e. the second communication unit (32)) of the second connector (22); while the readable/writable area of RFID tag (i.e. second communication unit (32)) of the second connector (22) stores at least the first identifier from the RFID tag (i.e. first communication unit (31)) of the first connector (21), enabling the matching of two ends of patch cord. In addition, writing and reading to the RFID tags may be realized by RFID reader through non-contact communication via an RFID antenna.

According to the embodiment of the present invention, the first communication unit (31) and second communication unit (32) may be attached to the first connector (21) and the second connector (22) by various physical and/or mechanical means. According to some embodiments of the present invention, the first communication unit (31) and second communication unit (32) may be coupled to the first connector (21) and the second connector (22) by injection molding or adhesive. While in another embodiment of the present invention, the first communication unit (31) and second communication unit (32) may be detachably connected to the first connector (21) and the second connector (22) through a carrier. To be specific, the communication units can be connected to a connector by mechanical means such as embedding, surface mounting and snap joint, but also other means like injection molding and gluing. Any connection method may be applied as long as the firmness, reliability and tightness of connections between communication unit and the connector may be realized.

For example, in the embodiment illustrated in FIG. 1, the first communication unit (31) and second communication unit (32) are provided with detachably connected first and second carriers (29, 30). The first carrier (29) is detachably connected tothe first connector housing (18) of the first connector (21), and the second carrier (30) is detachably connected the second connector housing (28) of the second connector (22), by which patch cord (10) can be obtained on the basis of the existing patch cord that does not have the ability to store unique identifiers eliminating the need to redesign the patchcord.

It is thus clear that the patch cord provided by the embodiment of the present invention can differentiate the connectors at two ends of patch cord by self-identification, and matching of the two ends may be realized while maintaining the unique self-identification of each end of patch cord by ensuring two ends of the same patch cord respectively contain the information of the opposite end.

Figure 3A:
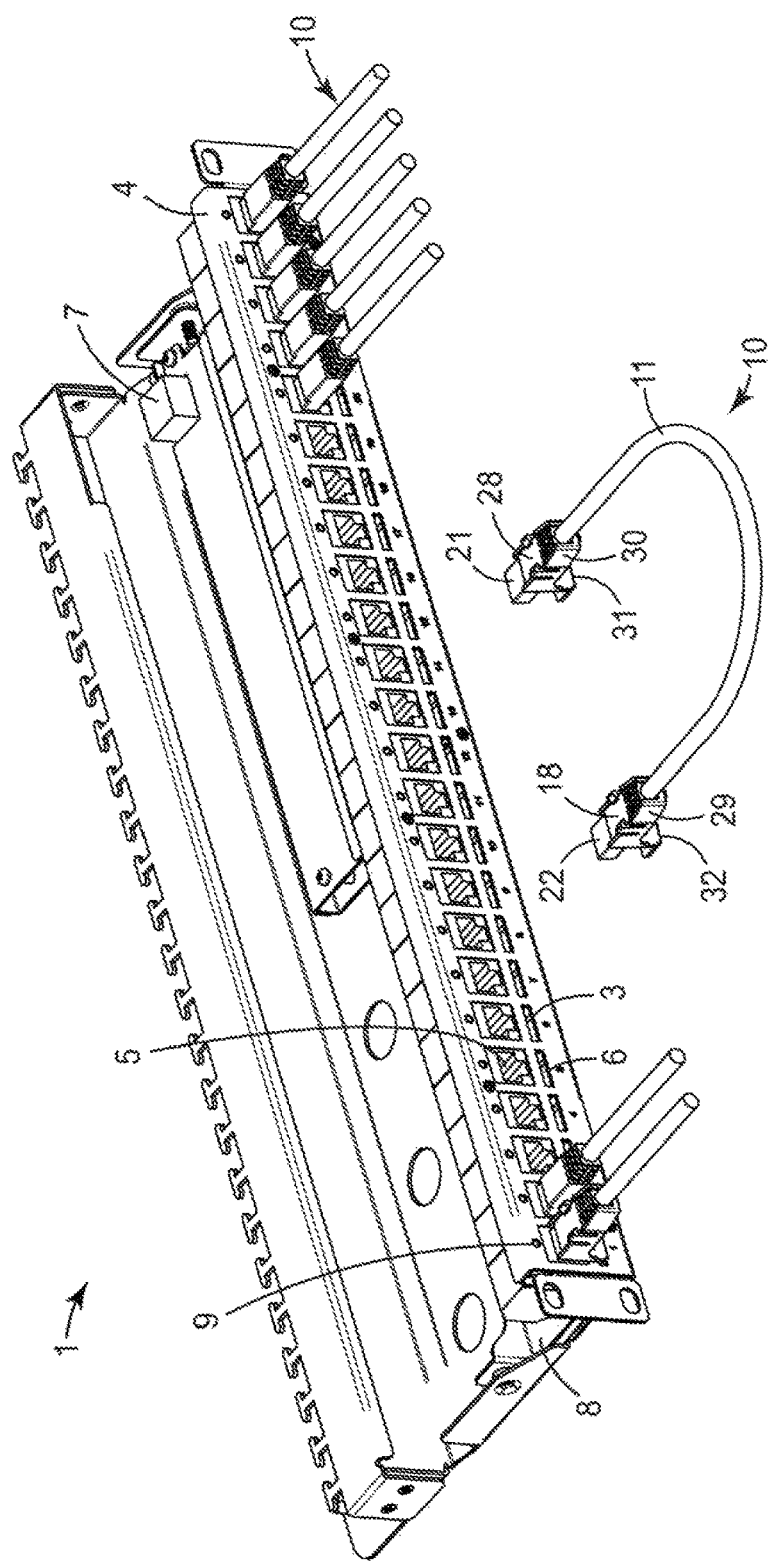
FIGS. 3A and 3B shows structure diagrams of a patch cord management system based on one specific embodiment of the present invention.
Figure 3B:
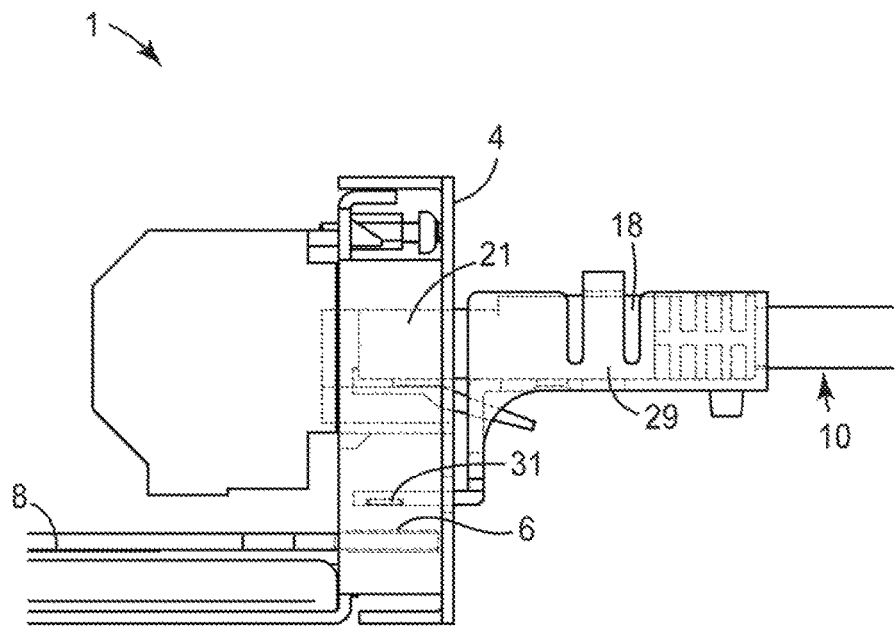

The embodiment of the present invention further provides a patch cord management system (1. As illustrated in FIGS. 3A and 3B, the patch cord management system comprises multiple patch cords (10), wiring panel (4), multiple communication matching units (6, FIG. 3B) and a communication terminal (7). The wiring panel (4) is provided with multiple ports (5) suitable for plugging in the first connector (21) and/or the second connector (22) of patch cord (10). The multiple communication matching units (6) are respectively arranged near the multiple ports (5) to wirelessly communicate with the first communication unit (31) and/or the second communication unit (32) after the communication units pass through slots (3) adjacent to the ports into which the connectors are inserted. The communication terminal (7) is connected to the multiple communication matching units (6). In one exemplary aspect, communication terminal (7) and multiple communication matching units (6) can be built into a printed circuit board (8). Alternatively they can be connected by wires. Other aspects of the patch cord, mentioned above, may be referred to in the description of the patch cord identification system of the present invention.

In the embodiment as illustrated in FIG. 3A, the first communication unit (31) and the second communication unit (32) can be RFID tags, and the communication matching unit (6), shown in FIG. 3B, can bean RFID antenna. The communication terminal (7) includes an RFID reader to read, write, andcontrol the information of the first communication unit (31) and the second communication unit (32). The first communication unit (31) and the second communication unit (32) communicate with the communication matching unit (6) by non-contact radio frequency identification technology.

In some aspects of the inventive system, the wiring panel (4) can include indicator elements (9) disposed adjacent to each port (5) which can be controlled by communication terminal (7).

In the patch cord management system as illustrated in the embodiments of the present invention, when one of the connectors (21, 22) of the patch cord (10) is inserted into any port (5) of wiring panel (4), the identifier stored in communication unit associated with the connector of patch cord may be read through the communication matching unit (6) arranged at the port, thereby confirming the connector is connected to the port and identifying the connector. In some embodiments, the communication matching unit arranged at the port may read the first or second composite identifier in the first or second communication unit of connector of the patch cord. If the first composite identifier is AB and the second composite identifier is BA, the system may identify that two ends are on a same patch cord, so two corresponding ports in the system database are marked as being interconnected by the same patch cord. In this way, the port and the connectors of the patch cord may be matched, which facilitatesapplications such as indication and checking patch cord connection relationships.

As every connector has a unique identifier and in some embodiments, every connector can have a unique composite identifier, the unique wiring panel port at the end of patch cord associated withunique identifier (A) and/or composite identifier (AB) may be identified by searching a system database for the unique identifier (A) and/or composite identifier (AB). Similarly, the other connector and port of the same patch cord may be identified. In this way, tracking a single port where one end of the patch cord is located becomes possible, which facilitatesthe application such as location and identification for port fault diagnosis or if one end of the patch cord is found, the second end can be located by cross referencing in the system database.

Conventional matching identification methods have patch cords with the same identifier at the two ends of the patch cord in the prior art. In these systems, if one identifier of the patch cord is known, it may be used to look for two ports on one patch cord, and the position of two ends of the patch cord in two corresponding ports cannot be further identified. In addition, accurately tracking the port where one side of the patch cord is located cannot be realized.

It is thus clear that for the patch cord management system provided by the embodiment of the present invention, the patch cord maintains the unique identifiability of connectors at each end with radio frequency technology by respectively arranging unique identifier on the connectors at both ends, so as to differentiate the connectors at both ends of patch cord by self-identification, and match the two ends while maintaining the unique self-identification of each end of patch cord by ensuring both ends of the same patch cord respectively contain the information of the opposite end.

Accordingly, the embodiment of the present invention further provides a patch cord management method. As illustrated in FIG. 1, the patch cord comprises a connection line portion (11), a first connector (21) arranged at the first end of the connection line portion (11), a second connector (22) arranged at the second end opposite to the first end of the connection line portion (11), a first communication unit (31) set to the first connector (21) and a second communication unit (32) set to the second connector (22).

Figure 4:
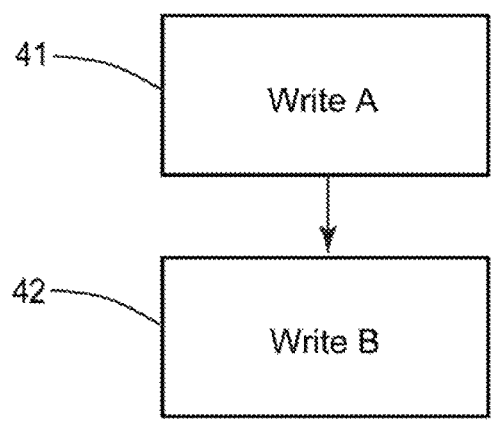
FIGS. 4-8 show flow diagrams outlining an exemplary patch cord management method based on some specific embodiments of the present invention.

FIG. 4 shows a block diagram representing writing the unique identifiers into the communication units. Patch cord management method provided by one embodiment of the present invention comprises the following steps: writing the first identifier (A) containing unique identity information for identifying corresponding first connector (21) in the first communication unit (31) of the patch cord represented by block 41, and writing the second identifier (B) containing unique identity information for identifying corresponding second connector (22) in the second communication unit

(32) of the patch cord represented by block 42, wherein the first identifier is different from the second identifier. Such steps may be completed by manufacturer of communication unit or by the user of the patch cord when communication unit is required to be installed into the network.

In some embodiments as shown for example in FIG. 2, the first communication unit (31) is provided with a first read-only area (311) and a first readable/writable area (312), while the second communication unit (32) is provided with a second read-only area (321) and a second readable/writable area (322). The first or second identifier (A, B) is stored in the read-only area (311, 321) of corresponding first connector (21) or second connector (22), respectively, so the first and/or second identifier will not be easily changed, and in particular, the first or second identifier will not be deleted due to an accident or misuse.

Figure 5:
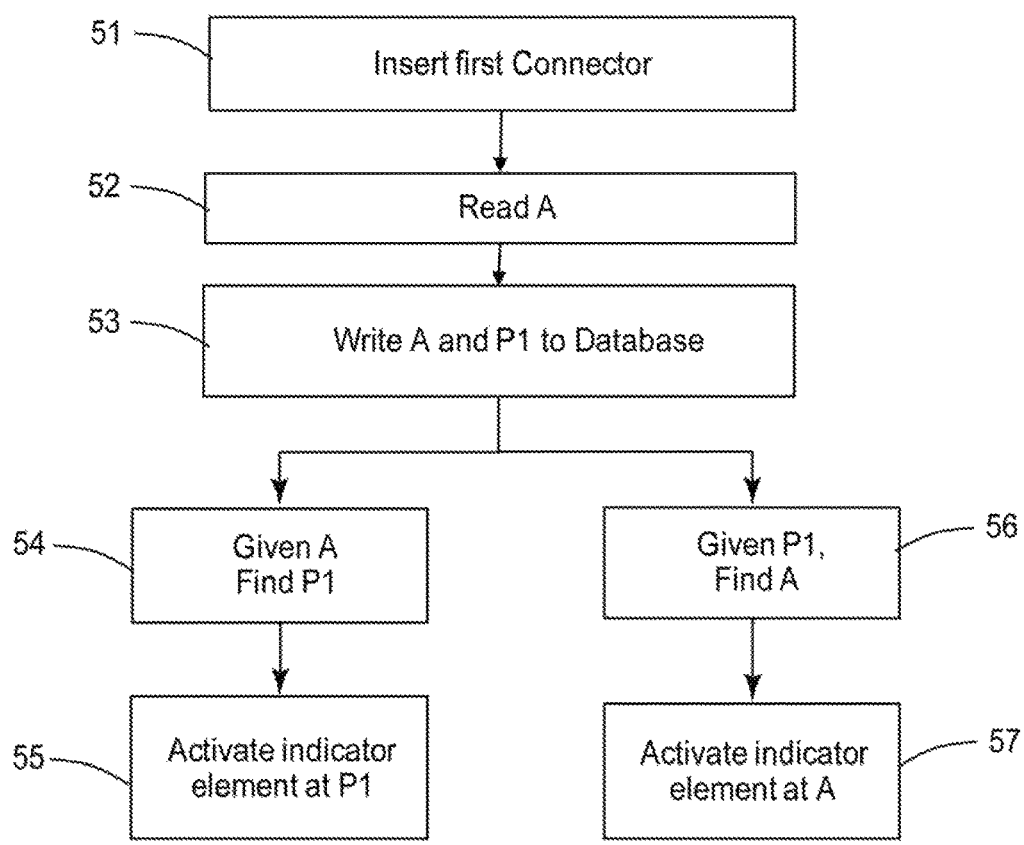

As illustrated in FIG. 5, the patch cord management method further comprises the following steps: inserting the first connector of the patch cord into one port of wiring panel (block 51), reading the first identifier (A) from the first communication unit (block 52) and writing the information of the first identifier (A) of the first communication unit corresponding to the first connector and the information of the port (P1) into the system database as shown in block 53. Optionally, this method can further comprise the following steps: looking for the information of corresponding port (P1) in the database based on the first identifier (A) (block 54), and locating the position of the first connector based on the identified information of the port (P1). In one exemplary aspect, this locating step can be facilitated by activating an indicator element at the port associated with the port information P1 as indicated by block 55. Alternatively, the method can optionally include the steps of looking for corresponding first identifier (A) based on the information of the port (P1) represented by block 56; and looking for and locating the position of the first connector based on the identified information of the port, or activating the indicator element at the location of identifier A as shown in block 57. Thus, the method includes means for using the port information to look for the connector or patch cord connected to the port, or using the first identifier to locate the specific port position of the connector in multiple ports on the wiring panel.

Figure 6:
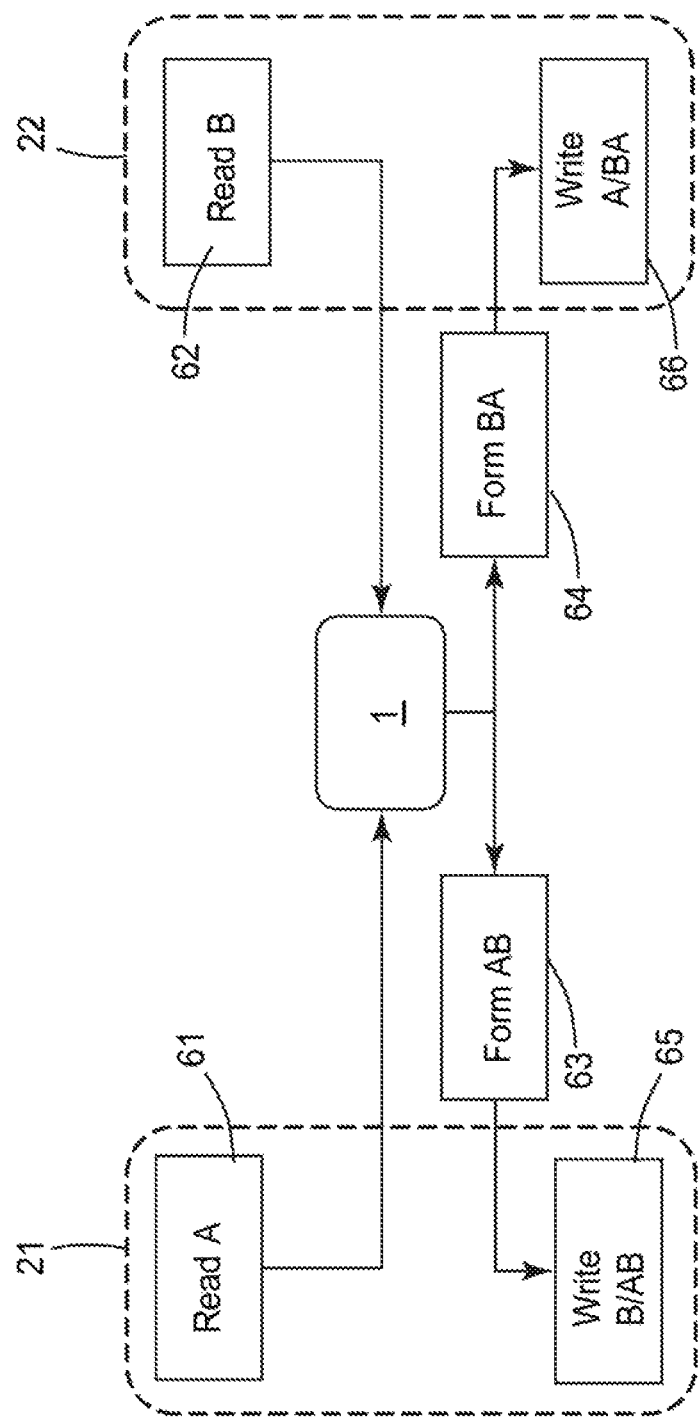

While in another embodiment illustrated in FIG. 6, Patch cord management system (1) can execute the patch cord management method comprising the following steps: reading the first identifier (A) in the first communication unit of connector (21, block 61), reading the second identifier (B) in the second communication unit of the second connector (22, block 62), writing the read first identifier (A) in the readable/writable portion of the second communication unit of the second connector (22, block 66); and writing the read second identifier (B) in the readable/writable portion of the first communication unit of the first connector (21, block 65). Optionally, this method may further comprises the following steps: forming the first composite identifier (AB) with the first identifier (A) and the second identifier (B) according to certain rules as represented by block 63 and storing the first composite identifier (AB) in the readable/writable portion of the first communication unit of the first connector (21, block 65). Additionally, the second composite identifier (BA) can be formed with the second identifier (B) and the first identifier (A) according to certain rules as represented by block 64 and storing the second composite identifier (BA) in the readable/writable portion of the second communication unit of the second connector (22, block 66). The first composite identifier and the second composite identifier can be the same or be different depending on how they are created. Preferably, the first composite identifier is different from the second composite identifier, so different first and second composite identifiers may be utilized to differentiate the first connector and the second connector. Then, the first connector and the second connector of the same patch cord is connected can be realized using the first composite identifier and the second composite identifier to respectively label the first connector and the second connector at two ends of a patch cord, and identifying the port of the other end through the composite identifier at one end.

Figure 7:
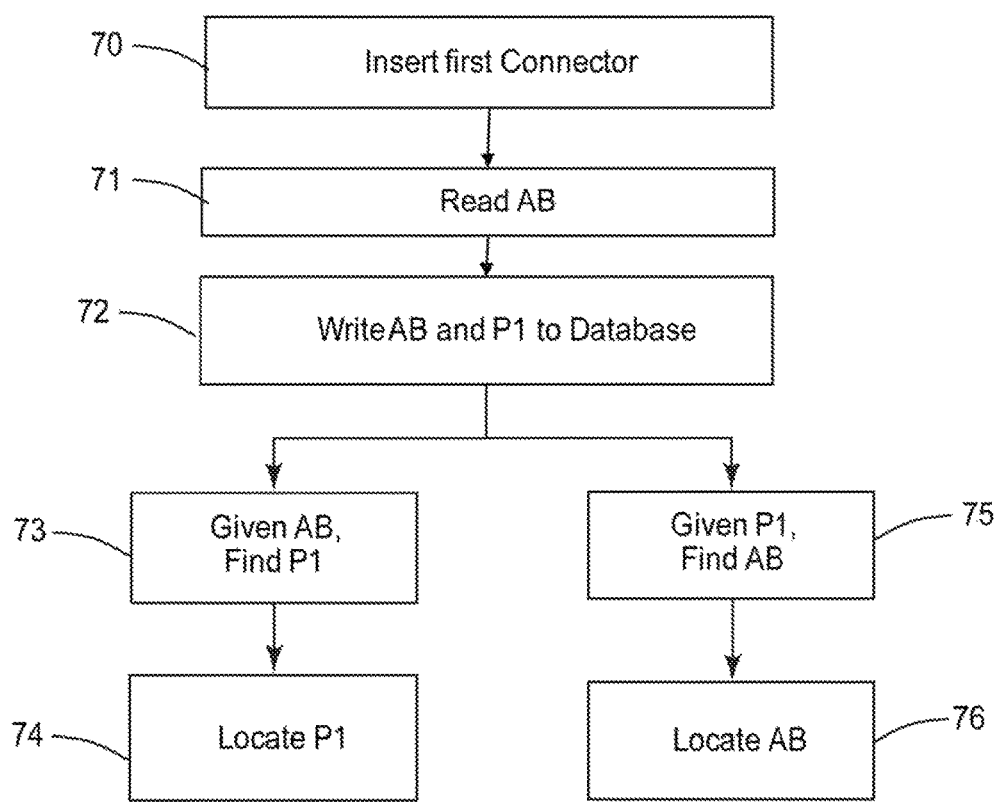

Optionally, according to another embodiment as illustrated in FIG. 7, method shown in FIG. 6 can further comprise the following steps: inserting the first connector of the patch cord into one port of wiring panel (block 70), reading the first composite identifier (AB) from the first communication unit of the connector (block 71) and writing the information of the first composite identifier (AB) of the first communication unit and the information of the port (P1) into the system database (block 72). Optionally, this method can further comprise: looking for the information of corresponding port (P1) in the database based on the first composite identifier (AB, block 73) and looking for and locating the first connector based on the identified information of the port (P1); or looking for corresponding first composite identifier (AB) based on the information of the port (P1) and looking for and locating the position of the port based on the first composite identifier (AB), thereby realizing using the first composite identifier and/or port information to look for and locate the first connector and the port for insertion.

Figure 8:
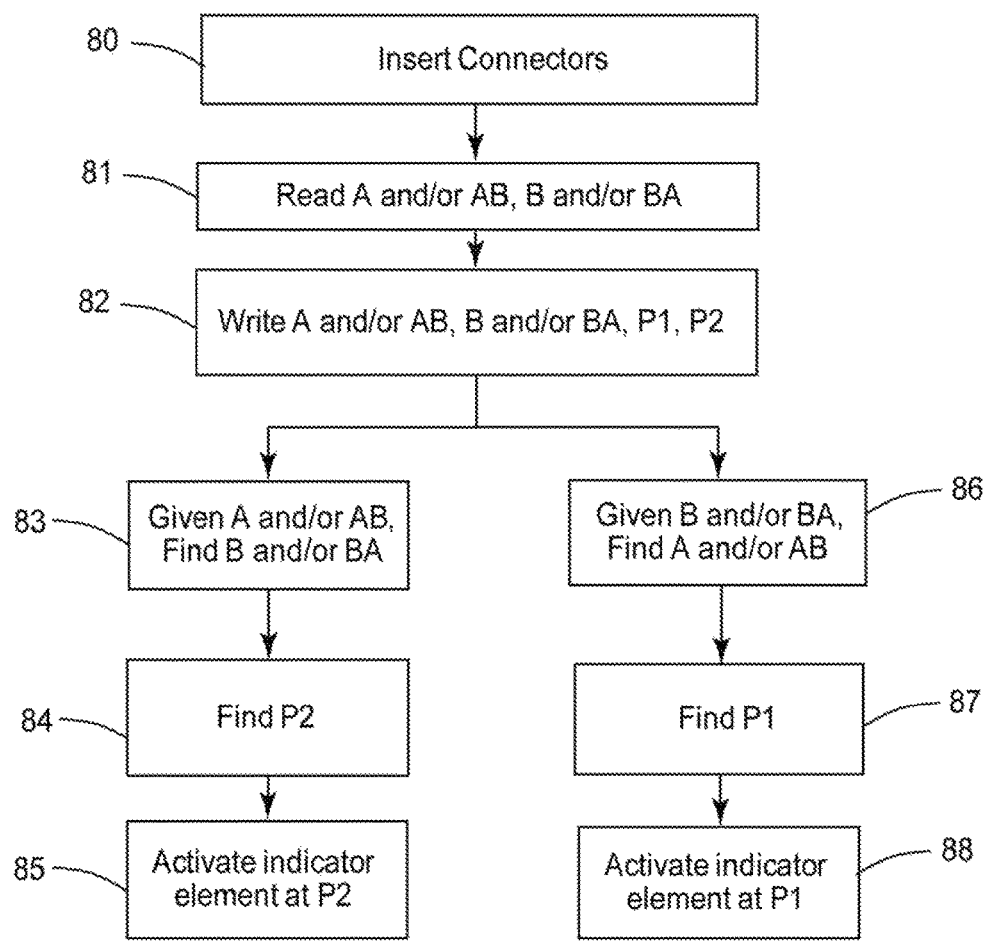

Another embodiment of the present invention as illustrated in FIG. 8, this method comprises the steps of inserting the first connector and second connector of the patch cord into corresponding ports of wiring panel, (block 80), reading the identifiers (A, AB, B, and/or BA) from the communication units in the connectors (block 81); writing the information of the first identifier (A) and/or first composite identifier (AB) of the first communication unit and the information of port (P1) corresponding to the first connector into the system database and writing the information of the second identifier (B) and/or second composite identifier (BA) of the second communication unit and the information of port (P2) corresponding to the second connector into the system database as represented by block 82. Optionally, a relationship between the first communication unit and second communication unit is established in the database. This method can further comprise the following steps: looking for the second identifier (B) and/or the second composite identifier of the second connector in the database according to the first identifier (A) and/or first composite identifier (AB) (block 83), and looking for and locating the port information (P2) for second connector according to the identified second identifier (B) or composite identifier (BA) (block 84). The system may optionally activate the indicator element on the wiring panel to aid in the physical location of the second connector (block 85). Blocks 86-88 represent the analogous process for finding the first connector when provided with the second identifier (B) and/or the second composite identifier (BA). Thus, the identifier and/or composite identifier at one end of patch cord can be used to look for and locate the position of the connector at the other end of the patch cord and its corresponding port.

According to some embodiments of the present invention, in the above mentioned patch cord identification method, the first communication unit in the patch cord is coupled to the first connector by injection molding or adhesive and the second communication unit is coupled to the second connector by injection molding or adhesive. Alternatively the first and second communication units can be detachably connected to the first and second connectors, respectively. Preferably, the first and second communication units are RFID tags in the patch cord identification method.

The patch cord applied in the patch cord management method can be metal cable or fiber optic cable, the first communication unit and the second communication unit can be RFID tags, and various physical and/or mechanical ways (e.g., injection molding, adhesive or detachable connection) may be adopted for the first communication unit and the second communication unit. The other aspects of the patch cord applied in the above mentioned patch cord management method may refer to the above explanation and description of patch cord as illustrated in the embodiment of the present invention. Therefore, there is no need for discussion herein.

The patch cord provided by the embodiment of the present invention can differentiate the connectors at two ends of patch cord by self-identification, and matching of the two ends may be realized while maintaining the unique self-identification of each end of patch cord by ensuring two ends of the same patch cord respectively contain the information of the opposite end.

The specific embodiments of the present invention are only exemplary and are employed to illustrate the principles and functions of the present invention, and are not intended to limitthe present invention. A person skilled in the art should understand that any changes or improvements of the present invention not departing from the spirit and scope of the present invention are still within the scope of the present invention. The protection scope of the present invention is subject to the scope defined by this patent application.

What is claimed is:

1. A patch cord, comprising:
a connection line portion;
a first connector arranged at a first end of the connection line portion; and
a second connector arranged at a second end opposite to the first end of the connection line portion;
and further comprising:
a first communication unit arranged near the first connector including a first read-only area, a first readable/writable area, and a first identifier, stored in the first read-only area; and
a second communication unit arranged near the second connector including a second read-only area, a second readable/writable area, and a second identifier stored in the second read-only area;
wherein the first and second identifiers contain unique identity information for identifying the first connector and the second connector respectively, and the first identifier is different from the second identifier,
wherein the first readable/writable area of the first communication unit at least stores the second identifier of the second communication unit; and the second readable/writable area of the second communication unit at least stores the first identifier of the first communication unit, and
wherein the first identifier and the second identifier form a first composite identifier in the first communication unit according to certain rules; and the second identifier in the second communication unit and the first identifier form a second composite identifier in the second communication unit according to certain rules such that the first composite identifier is different from the second composite identifier.

2. The patch cord according to claim 1, wherein:
the first identifier and the second identifier form the first composite identifier in sequence and the first composite identifier is stored in the first readable/writable area; and
the second identifier and the first identifier form the first composite identifier in sequence in the second communication unit, and the second composite identifier is stored in the second readable/writable area.

3. The patch cord according to claim 1, wherein:
the first communication unit is detachably connected to the first connector through a first carrier; and
the second communication unit is detachably connected to the second connector through a second carrier.

4. The patch cord according to claim 1, wherein the patch cord is a metal cable or a fiber optic cable.

5. The patch cord according to claim 1, wherein the first and second communication units are RFID tags.

6. A patch cord management system, comprising:
multiple patch cords comprising a connection line portion, a first connector arranged at a first end of the connection line portion and a second connector arranged at a second end opposite to the first end of the connection line portion, further comprising a first communication unit arranged near the first connector including a first identifier stored in a first read-only area of the first communication unit, and a second communication unit arranged near the second connector including a second identifier stored in a second read-only area of the second communication unit, wherein the first and second identifiers contain unique identity information for identifying the first connector and the second connector respectively, and the first identifier is different from the second identifier;
a wiring panel with multiple ports suitable for plugging in the first connectors or the second connectors of the patch cords;
at least one communication matching unit respectively arranged near the multiple ports to wirelessly communicate with the first communication units and/or the second communication units to read the first and second identifiers from the first and second communication units and to write a first composite identifier formed from the first and second identifiers to a first readable/writable area of the first communication unit and a second composite identifier formed from the first and second identifiers to a second readable/writable area of the second communication unit, such that the first composite identifier is different from the second composite identifier; and
a communication terminal connected to the at least one communication matching unit.

7. The patch cord management system according to claim 6, wherein:
the first and second communication units are RFID tags; the at least one communication matching unit is an RFID antenna; the communication terminal includes an RFID reader; and the first and second communication units communicate with the at least one communication matching unit by non-contact radio frequency identification technology.

8. A patch cord management method, wherein a patch cord comprises a connection line portion, a first connector arranged at a first end of the connection line portion, a second connector arranged at a second end opposite to the first end of the connection line portion, a first communication unit arranged near the first connector, and a second communication unit arranged near the second connector;

the method comprises the following steps:
writing a first identifier including unique identity information for identifying the corresponding first connector to the first communication unit of the patch cord;
writing a second identifier including unique identity information for identifying the corresponding second connector to the second communication unit of the patch cord, wherein the first identifier is different from the second identifier;
reading the first identifier of the first communication unit;
reading the second identifier of the second communication unit;
writing the read first identifier to the second communication unit; and
writing the read second identifier to the first communication unit.

9. The patch cord management method according to claim 8, further comprising:
forming a first composite identifier with the first identifier and the second identifier in the first communication unit according to certain rules; and
forming a second composite identifier with the second identifier and the first identifier in the second communication unit according to certain rules,
wherein the first composite identifier is different from the second composite identifier.

10. The patch cord management method according to claim 9, further comprising:
inserting the first connector of the patch cord into one port of a wiring panel; and
writing the first composite identifier of the first communication unit and the port into a database.

11. The patch cord management method according to claim 10, further comprising:
looking for information of a corresponding port in the database according to the first composite identifier or looking for corresponding first identifier according to the information of the port; and
looking for and locating the first connector according to the identified information of the port or looking for and locating a position of the port according to the first composite identifier.

12. The patch cord management method according to claim 9, further comprising:
inserting the first connector and the second connector of the patch cord into first and second ports of a wiring panel, respectively;
writing the first identifier and the first composite identifier of the first communication unit and information of a first port into a database; and
writing the second identifier and the second composite identifier of the second communication unit and information of a second port into the database.

13. The patch cord management method according to claim 12, further comprising:
looking for the second identifier of the second connector in the database according to the first identifier and/or the first composite identifier; and
looking for the second connector according to the second identifier.

14. The patch cord management method according to claim 8, further comprising:
inserting the first connector of the patch cord into one port of a wiring panel; and
writing the first identifier of the first communication unit corresponding to the first connector and information of the port into a database.

15. The patch cord management method according to claim 14, further comprising:
looking for the information of a corresponding port in the database according to the first identifier or looking for the corresponding first identifier according to the information of the port; and
looking for and locating the first connector according to the identified information of the port or looking for and locating the position of the port according to the identified first identifier.

* * * * *

UNITED STATES PATENT AND TRADEMARK OFFICE
CERTIFICATE OF CORRECTION

PATENT NO. : 10,132,851 B2
APPLICATION NO. : 15/520657
DATED : November 20, 2018
INVENTOR(S) : Xiaoyang Bai et al.

Page 1 of 1

It is certified that error appears in the above-identified patent and that said Letters Patent is hereby corrected as shown below:

In the Claims

In Column 12, Line 6, Claim 2, delete "first" and insert -- second --, therefor.

In Column 13, Line 12, Claim 8, delete "identifier;" and insert -- identifier: --, therefor.

Signed and Sealed this
Eighteenth Day of August, 2020

Andrei Iancu
*Director of the United States Patent and Trademark Office*